United States Patent
Yin et al.

(10) Patent No.: US 8,440,558 B2
(45) Date of Patent: May 14, 2013

(54) SEMICONDUCTOR DEVICE AND METHOD OF FABRICATING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Scineces, Beijing (CN)

( * ) Notice: Subject to any disclaimer, the term of this patent is extended or adjusted under 35 U.S.C. 154(b) by 39 days.

(21) Appl. No.: 12/991,012

(22) PCT Filed: Sep. 16, 2010

(86) PCT No.: PCT/CN2010/001419
§ 371 (c)(1),
(2), (4) Date: Nov. 4, 2010

(87) PCT Pub. No.: WO2011/124001
PCT Pub. Date: Oct. 13, 2011

(65) Prior Publication Data
US 2011/0272767 A1    Nov. 10, 2011

(30) Foreign Application Priority Data
Apr. 9, 2010    (CN) .......................... 2010 1 0145088

(51) Int. Cl.
*H01L 29/772*    (2006.01)
(52) U.S. Cl.
USPC    438/586; 257/412; 257/E21.19; 257/E29.242
(58) Field of Classification Search ................... 257/412, 257/E21.19, E29.242; 438/586
See application file for complete search history.

(56) References Cited

U.S. PATENT DOCUMENTS
2002/0142531 A1    10/2002  Hsu .............................. 438/183
2006/0051915 A1*   3/2006   Kadoshima et al. .......... 438/216
(Continued)

FOREIGN PATENT DOCUMENTS
CN    1130762         12/2003
JP    2007141905      6/2007

OTHER PUBLICATIONS
International Search Report and Written Opinion written in Chinese language for PCT/CN2010/001419; date Apr. 9, 2010; 9 pages.
(Continued)

*Primary Examiner* — Marc Armand
(74) *Attorney, Agent, or Firm* — Westman, Champlin & Kelly, P.A.

(57) ABSTRACT

There is provided a semiconductor device and a method of fabricating the same. The method comprises: providing a semiconductor substrate; forming a transistor structure on the semiconductor substrate, wherein the transistor structure comprises a gate region and a source/drain region, and the gate region comprises a gate dielectric layer provided on the semiconductor substrate and a sacrificial gate formed on the gate dielectric layer; depositing a first interlayer dielectric layer, and planarizing the first interlayer dielectric layer to expose the sacrificial gate; removing the sacrificial gate to form a replacement gate hole; forming first contact holes at positions corresponding to the source/drain region in the first interlayer dielectric layer; and filling a first conductive material in the first contact holes and the replacement gate hole respectively to form first contacts and a replacement gate, wherein the first contacts come into contact with the source/drain region. Thereby, the replacement gate and the first contacts can be made in one same step of depositing the same material, and thus the process flows are simplified.

7 Claims, 6 Drawing Sheets

U.S. PATENT DOCUMENTS

2006/0084273 A1* 4/2006 Kohyama et al. ............ 438/694
2010/0090292 A1* 4/2010 Nakajima ..................... 257/410
2010/0102394 A1* 4/2010 Yamakawa et al. ........... 257/369

OTHER PUBLICATIONS

Chinese patent application No. 200910092514.3 with English translation of the Abstract, filed prior to Nov. 2010; 21 pages.

First Chinese Office Action for Chinese Patent Application No. 201010145088.8, dated Aug. 17, 2012, 6 pages.

English translation for first Chinese Office Action for Chinese Patent Application No. 201010145088.8, dated Aug. 17, 2012, 4 pages.

* cited by examiner

SEMICONDUCTOR DEVICE AND METHOD OF FABRICATING THE SAME

CROSS-REFERENCE TO RELATED APPLICATION

This Application is a Section 371 National Stage Application of International Application No. PCT/CN2010/001419, filed Sep. 16, 2010, not yet published, the contents of which are hereby incorporated by reference in their entirety.

FIELD OF INVENTION

The present invention generally relates to the semiconductor field, particularly, to a semiconductor device and a method of fabricating the same, and more particularly, to a method of fabricating a semiconductor device comprising a replacement gate and the semiconductor device fabricated by the method.

BACKGROUND

With the continuously scaling of semiconductor devices, contact holes (CAs) and corresponding contact portions are becoming smaller, with the distances therebetween also being reduced. There are following problems with the prior art for manufacturing a small contact hole/contact: (1) As the etching depth on a gate is different from that in source/drain regions, short circuits likely occur between the contact hole and the gate; (2) As the etching depth in the source/drain regions is large whereas the size of openings thereof is small (i.e., it has a small width-to-height ratio), a number of process defects such as underetching, cavities in metal-filling plugs, and so on may be caused. Thus, the selection of processes is restricted, and the parasitic resistance increases.

To solve the above problems, the applicant has proposed the following process (Chinese Application No. 200910092514.3, Attorney Docket No. IB094429). Specifically, a first interlayer dielectric layer is deposited on a semiconductor substrate with a transistor structure (including a gate and source/drain) formed thereon, and then is subjected to planarization such as Chemical Mechanical Polishing (CMP) so that the gate is exposed. Then, contact holes are formed in the first interlayer dielectric layer at positions corresponding to the source/drain, and are filled with a conductive material such as metals, so as to form bottom contacts coming into contact with the source/drain. Next, a second interlayer dielectric layer is further deposited, and contact holes are further formed in the second interlayer dielectric layer at positions corresponding to the gate and the source/drain and are also filled with a conductive material such as metals, so as to form top contacts coming into contact with the gate and the source/drain.

Thus, the contacts are formed in two steps, reducing the difficulty in forming the contacts just by a single step. Further, in forming the top contacts, the contact holes at the gate and source/drain regions have the same etching depth. Therefore, the problems in the prior art as described above can be overcome.

However, if this process is applied to the replacement gate process, generally filling of gate metal and filling of metal in contact holes are carried out respectively; further, the gate metal and the metal filled in the contact holes are different from each other (see the above application No. 200910092514.3 filed by the applicant). Furthermore, a CMP process is necessary after the bottom contacts coming into contact with the source/drain are formed. Such a CMP process is complicated and has very stringent requirements thereon.

In view of the above, there is a need for a novel semiconductor device and a method of fabricating the same, whereby it is possible to simplify the process flows.

SUMMARY OF THE INVENTION

It is an object of the present invention to provide a semiconductor device and a method of fabricating the same, to overcome the problems in the prior art as described above, and especially to simplify the replacement gate process.

According to an aspect of the present invention, there is provided a method of fabricating a semiconductor device, comprising: providing a semiconductor substrate; forming a transistor structure on the semiconductor substrate, wherein the transistor structure comprises a gate region and a source/drain region, and the gate region comprises a gate dielectric layer provided on the semiconductor substrate and a sacrificial gate formed on the gate dielectric layer; depositing a first interlayer dielectric layer, and planarizing the first interlayer dielectric layer to expose the sacrificial gate; removing the sacrificial gate to form a replacement gate hole; forming first contact holes at positions corresponding to the source/drain region in the first interlayer dielectric layer; and filling a first conductive material in the first contact holes and the replacement gate hole respectively to form first contacts and a replacement gate, wherein the first contacts come into contact with the source/drain region.

Preferably, after forming the first contacts and the replacement gate, the method may further comprise: depositing a second interlayer dielectric layer; forming second contact holes at positions corresponding to the first contacts and the replacement gate respectively in the second interlayer dielectric layer; and filling a second conductive material in the second contact holes to form second contacts, wherein the second contacts corn into contact with the first contacts and the replacement gate respectively.

Preferably, after forming the replacement gate hole and before forming the first contact holes, the method may further comprise: forming a work function tuning layer in the replacement gate hole. More preferably, after forming the first contact holes and before filling the first conductive material, the method may further comprise: forming a liner in the first contact holes.

Preferably, after forming the first contact holes and before filling the first conductive material, the method may further comprise: forming a liner in the first contact holes and the replacement gate hole, wherein the portion of the liner in the replacement gate hole serves as a work function tuning layer.

Preferably, after forming the second contact holes and before filling the second conductive material, the method may further comprise: forming a liner in the second contact holes.

Preferably, the first conductive material may comprise Ti, Al or an alloy thereof.

According to another aspect of the invention, there is provided a semiconductor device, comprising: a semiconductor substrate; a transistor structure formed on the semiconductor substrate, wherein the transistor structure comprises a gate region and a source/drain region, and the gate region comprises a gate dielectric layer provided on the semiconductor substrate and a replacement gate formed on the gate dielectric layer; a first interlayer dielectric layer formed on the semiconductor substrate; and first contacts formed at positions corresponding to the source/drain region in the first interlayer dielectric layer, wherein the first contacts come into contact with the source/drain region, and wherein the first contacts and the gate are formed of the same conductive material layer.

Preferably, the semiconductor device may further comprise: a second interlayer dielectric layer formed on the first interlayer dielectric layer; and second contacts formed at positions corresponding to the first contacts and the replacement gate respectively in the second interlayer dielectric layer, wherein the second contacts come into contact with the first contacts and the replacement gate respectively.

Preferably, the bottom and sidewalls of the replacement gate may be covered by a work function tuning layer; the bottom and sidewalls of the first contacts may be covered by a liner; and the work function tuning layer and the liner each may comprise any one of TiN, TiAlN, TaN, TaAlN, Ta and Ti, or any combination thereof. More preferably, the work function-tuning layer and the liner may be formed of the same material layer.

Preferably, the conductive material layers for the first contacts and the replacement gate may comprise Ti, Al or an alloy thereof.

According to embodiments of the invention, the replacement gate and the first contacts can be formed in the same step of depositing the same material. Therefore, the fabrication processes are simplified. Further, a portion of the liner for the first contacts may serve as the work function tuning layer, resulting in further simplified processes.

In addition, since the first contacts and the replacement gate are formed of the same material layer, the subsequent processes (for example, etching of the second contact holes, and selection of the liner for the second contacts) are easier to be optimized.

BRIEF DESCRIPTION OF THE DRAWINGS

The above and other objects, features and advantages of the present invention will be more apparent by describing embodiments thereof in detail with reference to the attached drawings, wherein.

DETAILED DESCRIPTION OF PREFERRED EMBODIMENTS

Hereinafter, the present invention is described with reference to embodiments shown in the attached drawings. However, it is to be understood that those descriptions are just provided for illustrative purpose, rather than limiting the present invention. Further, in the following, descriptions of known structures and techniques are omitted so as not to obscure the concept of the present invention.

In the drawings, various structural diagrams and sectional views of semiconductor devices according to embodiments of the present invention are shown. However, they are not drawn to scale, and some features may be enlarged while some features may be omitted for clarity. Shapes, sizes and relative positions of respective regions and layers shown in the drawings are just illustrative, and deviations therefrom may occur due to manufacture tolerances and technical limits. Those skilled in the art can also devise regions/layers of different shapes, sizes and relative locations as desired.

FIGS. 1-13 are section views showing structures in respective steps during a flow for fabricating a semiconductor device comprising a replacement gate according to the embodiments of the present invention in detail. Hereinafter, the steps and the resulting semiconductor device are described in detail with reference to those drawings.

Figure 1:
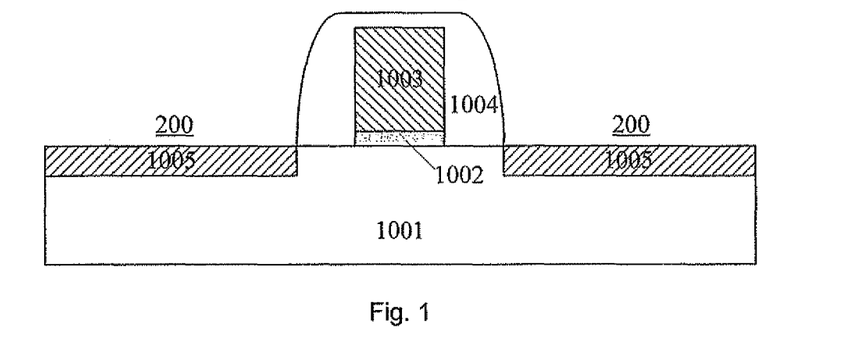
FIGS. 1-13 are section views showing structures in respective steps during a flow for fabricating a semiconductor device according to embodiments of the present invention.

First, as shown in FIG. 1, a semiconductor substrate 1001, for example, a Si substrate, is provided. Further, a transistor structure is formed on the semiconductor substrate 1001. Specifically, for example, the transistor structure comprises a gate region 100 and source/drain regions 200. For example, the gate region 100 comprises a gate dielectric layer 1002 provided on the semiconductor substrate, a sacrificial gate 1003 formed on the gate dielectric layer 1002, and a spacer 1004 around the gate body. Here, for example, the gate dielectric layer 1002 comprises a high-k material, the sacrificial gate 1003 comprises poly silicon, and the spacer 1004 comprises a nitride such as $SiN_x$. As an example of the invention, the gate dielectric layer 1002 has a thickness of about 1-3 nm, the sacrificial gate 1003 has a thickness of about 20-70 nm, and the spacer 1004 has a width in the horizontal direction shown in the figure of about 10-40 nm and a thickness of about 15-40 nm above the sacrificial gate 1003.

There are various ways to fabricate such a transistor structure. Since the fabrication of the transistor structure is not directly relevant to the subject matter of the invention, detailed descriptions thereof are omitted here.

Preferably, in order to reduce the contact resistance between the source/drain region 200 and the contacts to be formed, a silicide layer 1005 may be formed in the source/drain region 200. For example, the silicide layer 1005 may be formed by depositing a metal layer (for example, Ti, W or Co) on the semiconductor substrate with the transistor structure formed thereon, performing anneal so that the deposited metal reacts with Si in the source/drain region to generate a metal silicide, and then removing the unreacted metal. Such metal silicide will help to reduce the contact resistance between the source/drain region 200 and the contacts to be formed.

Figure 2:
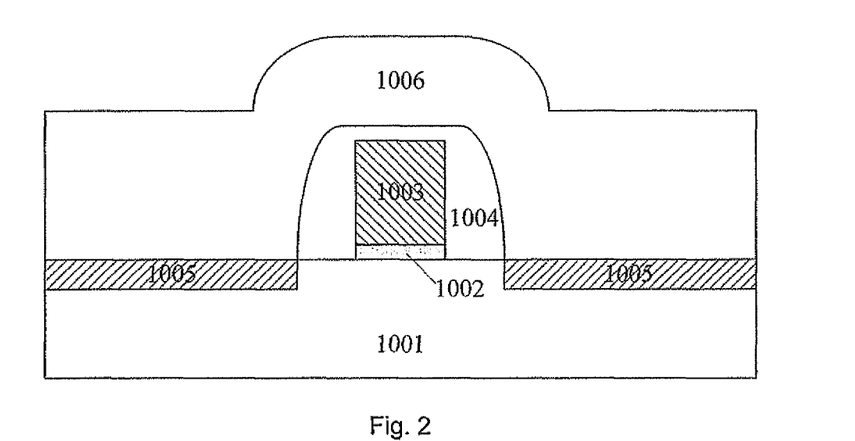

Then, as shown in FIG. 2, a first interlayer dielectric layer 1006 is deposited on the semiconductor substrate 1001 with the transistor structure formed thereon. For example, the first interlayer dielectric layer 1006 comprises un-doped silicon oxide ($SiO_2$), doped silicon oxide (e.g., Boro-Silicate Glass (BSG) and Boro-Phospho-Silicate Glass (BPSG)), silicon nitride ($Si_3N_4$), and the like.

In the present invention, the replacement gate process is employed to improve device performances. Specifically, a replacement gate is formed by replacing the above sacrificial gate 1003 with a metal material. Such a replacement gate process is known in the art per se, and thus detailed descriptions thereof are omitted. Here, it is to be noted that the layer(s) above the sacrificial gate 1003 should be removed to expose the sacrificial gate 1003 before replacing it.

Figure 3:
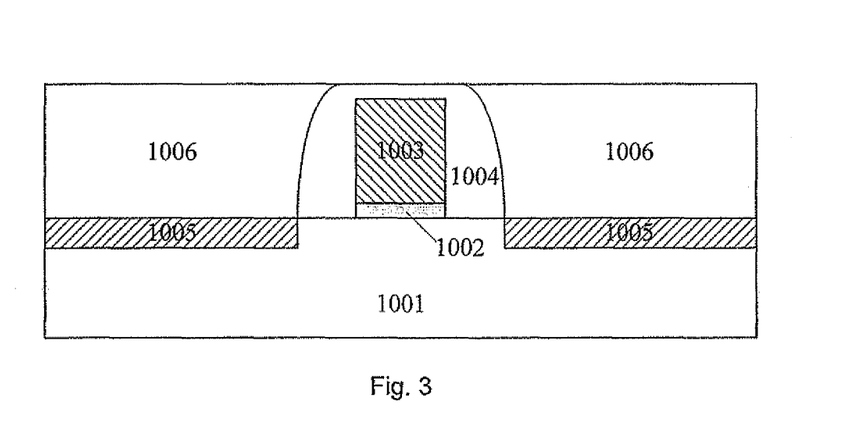
Figure 4:
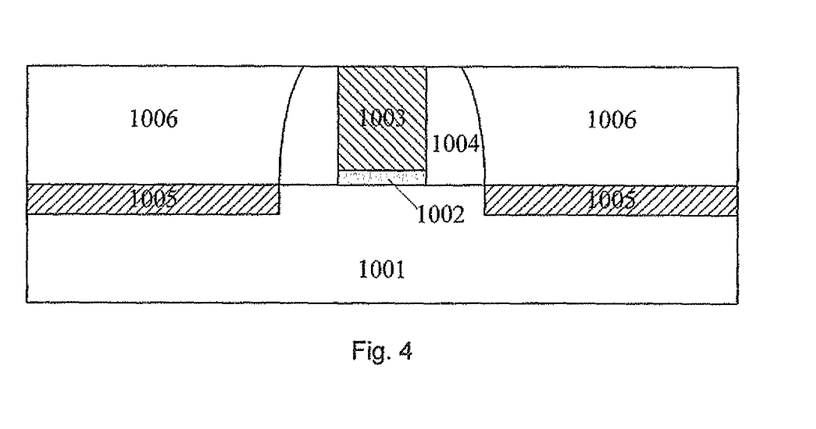

Thus, as shown in FIG. 3, the first interlayer dielectric layer 1006 is planarized, for example by Chemical Mechanical Polishing (CMP), until the spacer 1004 is exposed. Subsequently, as shown in FIG. 4, a portion of the spacer 1004 positioned above the sacrificial gate 1003 is further removed, for example, by means of further CMP or Reactive Ion Etching (RIE), so that the sacrificial gate 1003 is exposed.

In the above embodiment, after the transistor structure is made, the portion of the spacer 1004 positioned above the sacrificial gate 1003 (referred to as "cap layer" hereinafter) is not removed before depositing the first interlayer dielectric layer 1006, as shown in FIG. 2. However, the present invention is not limited thereto. For example, after the transistor structure is made and the silicide layer 1005 is formed by annealing, the cap layer at the top of the sacrificial gate 1003 may be removed, and then the first interlayer dielectric layer 1006 is deposited.

Figure 5:
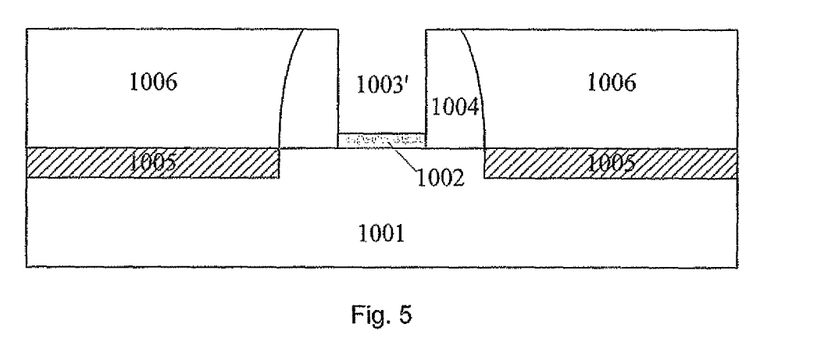

Next, as shown in FIG. 5, the sacrificial gate 1003 is removed for example by means of wet or dry etching, and thus a replacement gate hole 1003' is formed. Then, a replacement gate is formed by filling gate materials such as metals into the is replacement gate hole 1003'. Alternatively, the gate dielectric layer 1002 may be also replaced. Specifically, the gate dielectric layer 1002 is removed for example by means of etching, and then a further gate dielectric layer (not shown) is deposited. The further gate dielectric layer may comprise various high k materials, for example.

Figure 6:
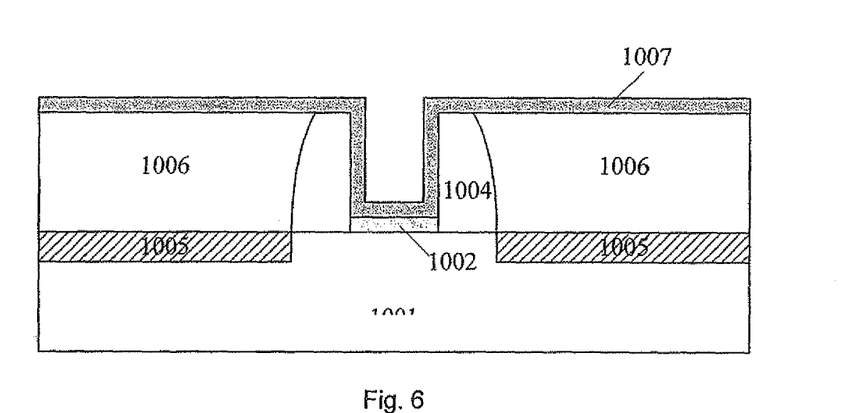

Preferably, in order to adjust the work function of the resulting gate, a work function tuning, layer may be formed in the replacement gate hole 1003'. To do this, for example, as shown in FIG. 6, a work function tuning layer 1007 is deposited. Then, the work function tuning layer 1007 may be subjected to a process such as CMP so that it only remains in the replacement gate hole 1003' (referring to FIG. 9), covering the bottom and sidewalls of the replacement gate hole 1003'. Here, in order to simplify the process flows, preferably the work function tuning layer 1007 is preserved as it is after it is deposited without any further processing. Then, portions of the work function tuning layer 1007 outside the replacement gate hole 1003' can be removed in a planarization step (for example, CMP) after the materials for the replacement gate and the conductive materials for the contacts are deposited (referring to FIG. 9).

The work function tuning layer 1007 may comprise any one of TiN, TiAlN, TaN, TaAlN, Ta and Ti, or any combination thereof. Further, preferably, the work function tuning layer 1007 may have a multi-layer structure, for example a dual-layer structure of TiN/TiAlN. The work function tuning layer 1007 has a thickness of about 3-10 nm, for example.

Figure 7:
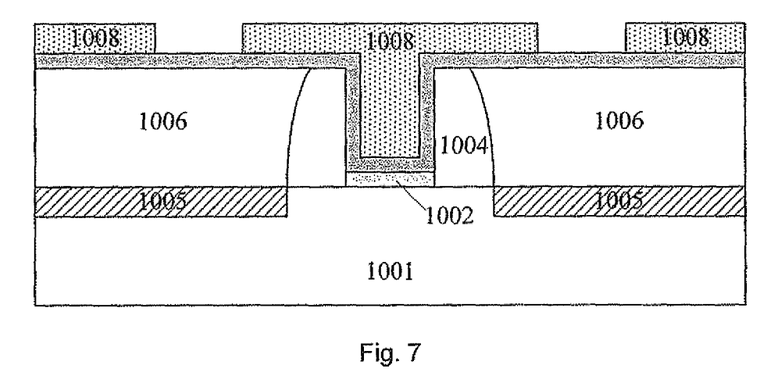
Figure 8:
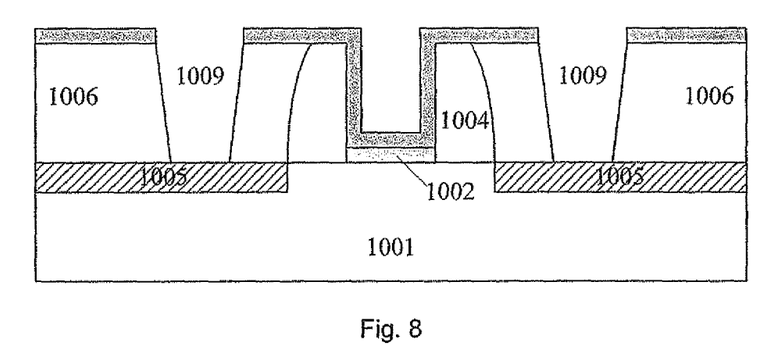

Subsequently, as shown in FIGS. 7 and 8, contact holes 1009 corresponding to the source/drain region are formed in the first interlayer dielectric layer 1006 by, for example, photolithography, and specifically, by forming a photo resist mask 1008 (referring to FIG. 7) and then carrying out etching and resist removal. At the bottom of the contact holes, the source/drain region is exposed, or alternatively the silicide layer 1005 formed in the source/drain region is exposed (referring to FIG. 8). According to an embodiment of the present invention, the contact holes 1009 have a width (in the horizontal direction shown in the figure) of about 15-100 nm.

Figure 9:
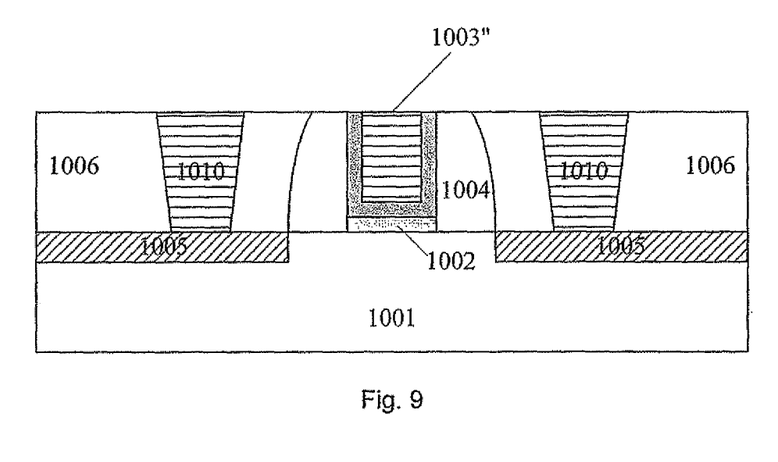

Next, as shown in FIG. 9, a conductive material is filled into the contact holes 1009 and also into the replacement gate hole 1003' so as to form first source/drain contacts 1010 and a gate 1003". For example, a layer of conductive material such as Al, W, AlTi, Cu, TiN, TaN, Ti or Ta is deposited. Preferably, this layer of conductive material comprises Ti, Al, or an alloy thereof. This is because the resistivity of Ti or Al is small and thus it helps to reduce the gate resistance. And then, the deposited conductive material is planarized for example by CMP until the first interlayer dielectric layer 1006 is exposed. Thus, the conductive material is filled in the contact holes 1009 and the replacement gate hole 1003'. Here, the first source/drain contacts 1010 come into contact with the underlying source/drain region (or alternatively, the silicide layer 1005 formed in the source/drain region).

Figure 14:
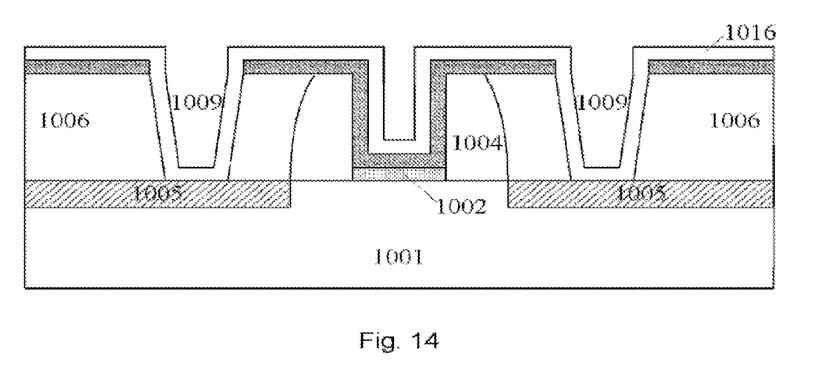
FIG. 14 is a section view showing a structure where a liner is formed in contact holes and a replacement gate hole according to a further embodiment of the present invention.
Figure 15:
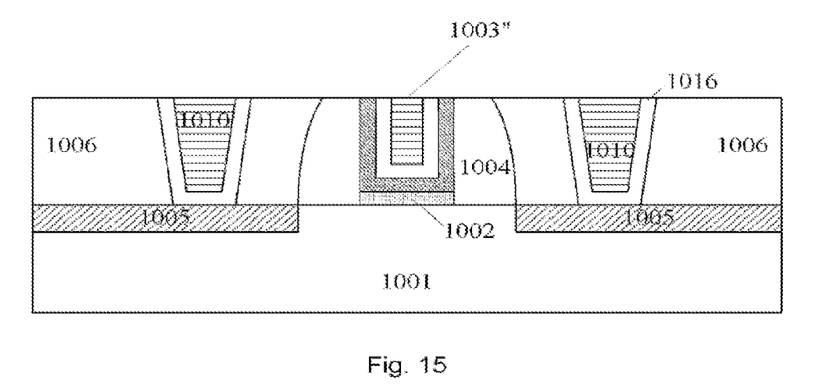
FIG. 15 is a section view showing the structure shown in FIG. 14 with the contact holes and the replacement gate hole filled according to a further embodiment of the present invention.

Preferably, a liner may be formed in the contact holes 1009 and/or the replacement gate hole 1003' before the conductive material is deposited as described above. For example, as shown in FIG. 14, a liner 1016 may be formed in both the contact holes 1009 and the replacement hole 1003'. For example, the liner 1016 may comprise any one of TiN, TiAlN, TaN, TaAlN, Ta and Ti, or any combination thereof. Further, alternatively, the liner 1016 may have a multi-layer structure, for example a dual-layer structure of TiN/TiAlN. The liner may have a thickness of about 2-10 nm. Then, as shown in FIG. 15, planarization is carried out when the conductive material is deposited as described above until the first interlayer dielectric layer 1006 is exposed.

Preferably, the liner may also serve as the work function tuning layer. At this point, the step of depositing the work function tuning layer 1007 as shown in FIG. 6 may be omitted. In such a case, when the replacement gate hole 1003' and the contact holes 1009 are formed (referring to FIG. 8 in which the work function tuning layer 1007 is not formed), a layer of material for the liner is deposited on the semiconductor substrate, and thus a portion of this layer in the contact holes 1009 (covering the bottom and sidewalls of the contact holes) serves as the liner for the contact, and a portion of this layer in the replacement gate hole 1003' (covering the bottom and sidewalls of the replacement gate hole) serves as the work function tuning layer for the gate.

Thus, the semiconductor device according to an embodiment of the invention is obtained. As shown in FIG. 9, the semiconductor device comprises: the semiconductor substrate 1001; the transistor structure formed on the semiconductor substrate, including the gate region and the source/drain region, wherein the gate region includes the gate dielectric layer 1002 and the replacement gate 1003", and the source/drain region preferably includes the silicide layer 1005; the first interlayer insulation layer 1006 formed on the semiconductor substrate 1001, with the first source/drain contacts 1010 to the source/drain region (or alternatively to the silicide layer 1005 in the source/drain region) formed therein. In this configuration, the gate 1003" and the first source/drain contacts 1010 are formed of the same conductive material layer (by depositing the same material in the same step).

After the semiconductor device is finished as above, it may be undergone further processes such as those described in the following so as to realize better contact to the outside.

Figure 10:
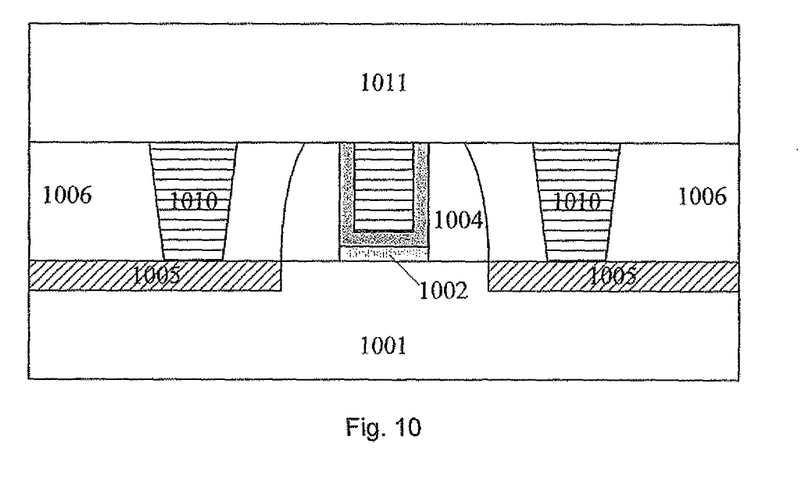

As shown in FIG. 10, a second interlayer dielectric layer 1011 is deposited on the first interlayer dielectric layer 1006. For example, the second interlayer dielectric layer 1011 may comprise un-doped silicon oxide ($SiO_2$), doped silicon oxide (e.g., Bore-Silicate Glass (BSG) and Boro-Phospho-Silicate Glass (BPSG)), silicon nitride ($Si_3N_4$), and the like. Since the planarization process performed as described above (referring to FIG. 9), the second interlayer dielectric layer 1011 has a flat top surface.

Figure 11:
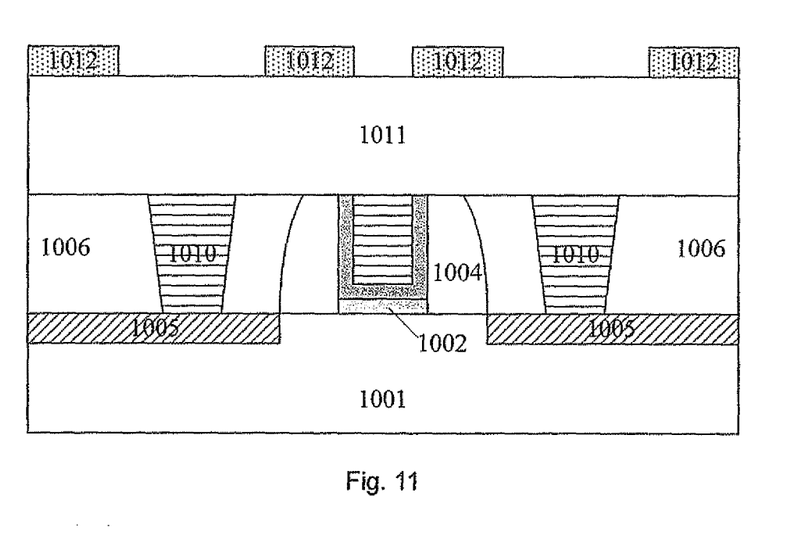
Figure 12:
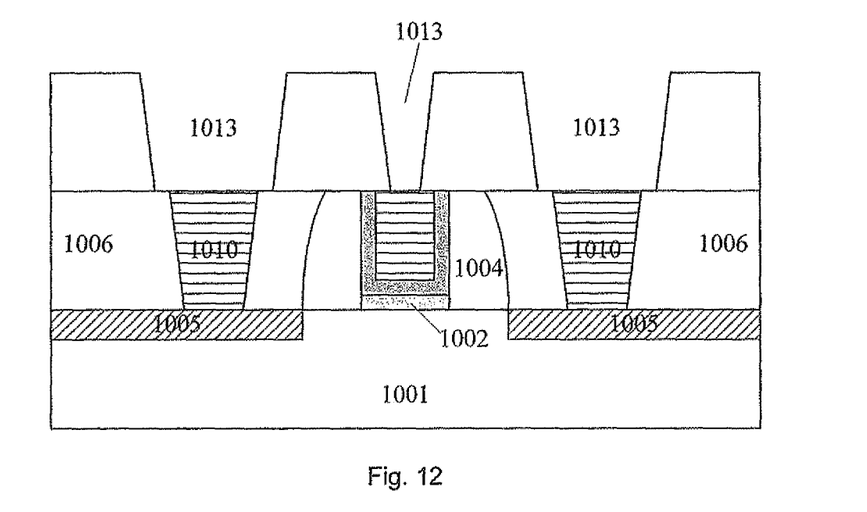

Then, as shown in FIGS. 11 and 12, contact holes 1013 corresponding to the source/drain region and gate region respectively are formed in the second interlayer dielectric layer 1011 by, for example, photolithography, and specifically, by first forming a photo resist mask 1012 (referring to FIG. 11) and then carrying out etching and resist removal. At the bottom of the contact holes, the first source/drain contacts 1010 and the gate 1003" are exposed (referring to FIG. 12). According to an embodiment of the present invention, the contact holes 1013 may have a width (in the horizontal direction shown in the figure) of about 20-150 nm.

Figure 13:
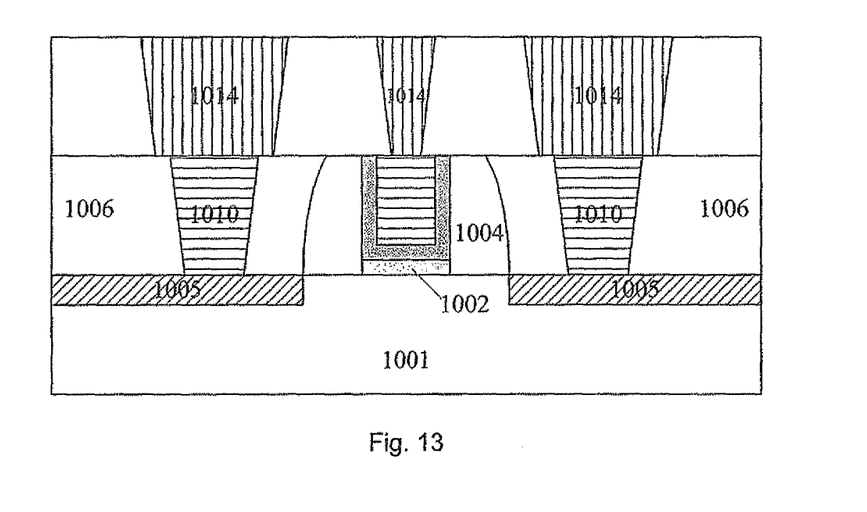

Next, as shown in FIG. 13, a conductive material is filled in the contact holes 1013 so as to form a second source/drain contact and a gate contact 1014. For example, a layer of conductive material such as Al, W, AlTi, Cu, TiN, TaN, Ti or Ta is deposited. And then, the deposited conductive material is planarized, for example, by CMP until the second interlayer dielectric layer 1011 is exposed. Thus, the conductive material is filled in the contact holes 1013. Here, the second source/drain contact 1014 comes into contact with the underlying first source/drain contact 1010, and the gate contact 1014 comes into contact with the gate 1003".

Preferably, a liner (not shown) may be formed in the contact holes 1013 before the conductive material is deposited as described above. For example, a liner may be deposited and then undergone processes such as selective etching so that this layer only remains in the contact holes 1013, covering the bottom and sidewalls of the contact holes 1013. Preferably, to simplify the process flows, the layer for the liner is preserved as it is after it is deposited, without any further process. Then, portions of the layer for the liner outside the contact holes 1013 can be removed in the planarization step (for example, CMP) after the conductive materials for the top contacts are deposited.

For example, the liner may comprise any one of TiN, TiAlN, TaN, TaAlN, Ta and Ti, or any combination thereof. Further, alternatively, the liner may have a multi-layer structure, for example a dual-layer structure of TiN/TiAlN. The liner may have a thickness of about 2-10 nm.

Finally, the semiconductor device according to another embodiment of the present invention is obtained, as shown in FIG. 13. As shown in FIG. 13, the semiconductor device comprises: the semiconductor substrate 1001; the transistor structure formed on the semiconductor substrate, including the gate region and the source/drain region, wherein the gate region includes the gate dielectric layer 1002 and the replacement gate 1003", and the source/drain region preferably includes the silicide layer 1005; the first interlayer insulation layer 1006 formed on the semiconductor substrate 1001, with the first source/drain contacts 1010 coming into contact with the source/drain region (or alternatively coming into contact with the silicide layer 1005 in the source/drain region) formed therein; and the second interlayer dielectric layer 1011 formed on the first interlayer dielectric layer 1006, with the second source/drain contact 1014 coming into contact with the first source/drain contact and the gate contact 1014 coming into contact with the gate 1003" formed therein. In this configuration, the gate 1003" and the first source/drain contact 1010 are formed by depositing the same conductive material in the same step.

According to the embodiments of the invention, the materials for the replacement gate and for the first source/drain contact is deposited in the same step. Therefore, the process flows are simplified, and thus the manufacture cost is reduced. Further, a portion of the liner for the contact can also serve as the work function tuning layer. As a result, it is easier to adjust the turn-on voltage Vth of the transistor.

Furthermore, since the first source/drain contact and the replacement gate are formed of the same material layer, it is possible to simplify subsequent processes and selection of materials, such as etching of the top contacts, and selection of the liner to reduce the contact resistance with the bottom contacts. For example, since the bottom contacts and the gate are of the same material, the etching stop layer of the same material is formed in the etching of the top contact holes. Thus, it is possible to greatly simplify the etching process.

In the above description, details of the pattering and etching of the respective layers are not provided. It is to be understood by those skilled in the art that various means in the prior art may be utilized to form the layers and regions in desired shapes. Further, to achieve the same feature, those skilled in the art can devise different methods from those described above.

The present invention is described above with reference to the embodiments thereof. However, those embodiments are provided just for illustrative purpose, rather than limiting the present invention. The scope of the invention is defined by the attached claims as well as the equivalents thereof. Those skilled in the art can make various alternations and modifications without departing from the scope of the invention, which all fall into the scope of the invention.

What is claimed is:

1. A method of fabricating a semiconductor device, comprising:
   providing a semiconductor substrate;
   forming a transistor structure on the semiconductor substrate, wherein the transistor structure comprises a gate region and a source/drain region, and the gate region comprises a gate dielectric layer provided on the semiconductor substrate and a sacrificial gate formed on the gate dielectric layer;
   depositing a first interlayer dielectric layer, and planarizing the first interlayer dielectric layer to expose the sacrificial gate;
   removing the sacrificial gate to form a replacement gate hole;
   forming first contact holes at positions corresponding to the source/drain region in the first interlayer dielectric layer; and
   filling a first conductive material in the first contact holes and the replacement gate hole respectively to form first contacts and a replacement gate, wherein the first contacts come into contact with the source/drain region.

2. The method according to claim 1, wherein after forming the first contacts and the replacement gate, the method further comprises:
   depositing a second interlayer dielectric layer;
   forming second contact holes at positions corresponding to the first contacts and the replacement gate respectively in the second interlayer dielectric layer; and
   filling a second conductive material in the second contact holes to form second contacts, wherein the second contacts come into contact with the first contacts and the replacement gate respectively.

3. The method according to claim 1, wherein after forming the replacement gate hole and before forming the first contact holes, the method further comprises:
   forming a work function tuning layer in the replacement gate hole.

4. The method according to claim 1, wherein after forming the first contact holes and before filling the first conductive material, the method further comprises:
   forming a liner in the first contact holes and the replacement gate hole, wherein the portion of the liner in the replacement gate hole serves as a work function tuning layer.

5. The method according to claim 1, wherein the first conductive material comprises Ti, Al or an alloy thereof.

6. The method according to claim 2, wherein after forming the second contact holes and before filling the second conductive material, the method further comprises:
   forming a liner in the second contact holes.

7. The method according to claim 3, wherein after forming the first contact holes and before filling the first conductive material, the method further comprises:
   forming a liner in the first contact holes.

* * * * *